United States Patent
Ramamurthy et al.

(10) Patent No.: US 7,811,877 B2
(45) Date of Patent: Oct. 12, 2010

(54) METHOD OF CONTROLLING METAL SILICIDE FORMATION

(75) Inventors: Sundar Ramamurthy, Fremont, CA (US); Majeed A. Foad, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 531 days.

(21) Appl. No.: 11/778,252

(22) Filed: Jul. 16, 2007

(65) Prior Publication Data

US 2009/0023257 A1     Jan. 22, 2009

(51) Int. Cl.
*H01L 21/8238* (2006.01)
(52) U.S. Cl. .............. 438/217; 438/197; 438/199; 438/592; 257/E21.632
(58) Field of Classification Search .......... 438/592, 438/217; 257/E21.632
See application file for complete search history.

(56) References Cited

U.S. PATENT DOCUMENTS

| | | | |
|---|---|---|---|
| 5,043,300 A | 8/1991 | Nulman | |
| 5,342,798 A | 8/1994 | Huang | |
| 5,710,438 A | 1/1998 | Oda et al. | |
| 6,057,215 A * | 5/2000 | Kitano | 438/533 |
| 6,200,883 B1 | 3/2001 | Taylor et al. | |
| 6,503,817 B1 | 1/2003 | Yu | |
| 6,512,258 B2 * | 1/2003 | Maeda | 257/303 |
| 6,528,381 B2 | 3/2003 | Lee et al. | |
| 6,596,594 B1 | 7/2003 | Guo | |
| 6,649,976 B2 | 11/2003 | Iwamatsu et al. | |
| 6,730,572 B2 | 5/2004 | Lee et al. | |
| 2005/0181584 A1 | 8/2005 | Foad et al. | |
| 2006/0289800 A1 | 12/2006 | Murrell et al. | |

* cited by examiner

*Primary Examiner*—Charles D Garber
*Assistant Examiner*—Angel Roman
(74) *Attorney, Agent, or Firm*—Moser IP Law Group

(57) ABSTRACT

Methods of processing silicon substrates to form metal silicide layers thereover having more uniform thicknesses are provided herein. In some embodiments, a method of processing a substrate includes providing a substrate having a plurality of exposed regions comprising silicon, wherein at least two of the plurality of exposed regions have a different rate of formation of a metal silicide layer thereover; doping at least one of the exposed regions to control the rate of formation of a metal silicide layer thereover; and forming a metal silicide layer upon the exposed regions of the substrate, wherein the metal silicide layer has a reduced maximum thickness differential between the exposed regions.

20 Claims, 4 Drawing Sheets

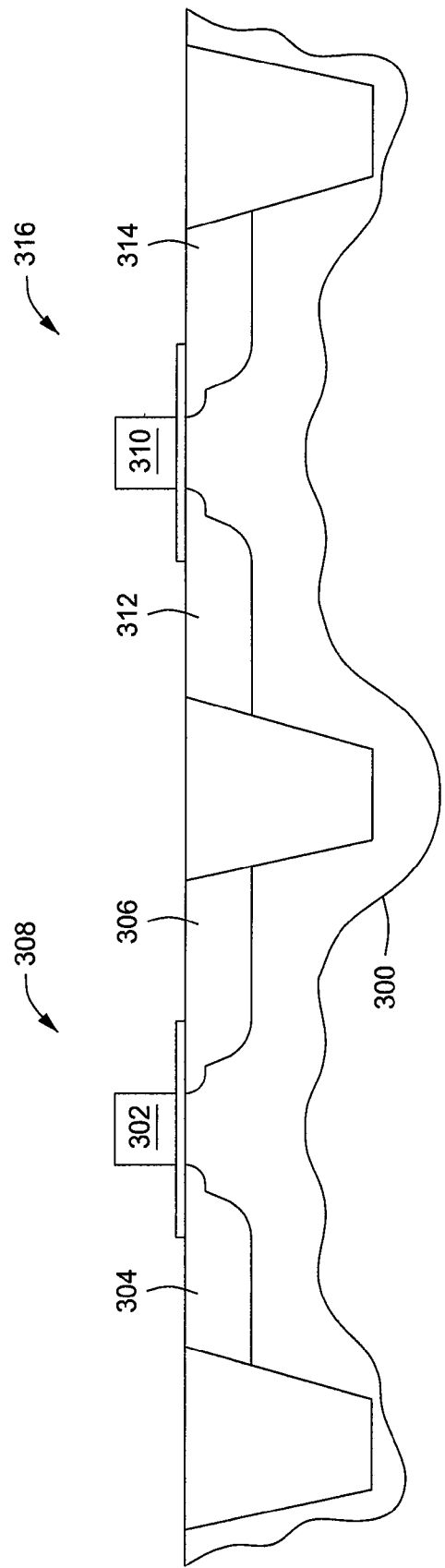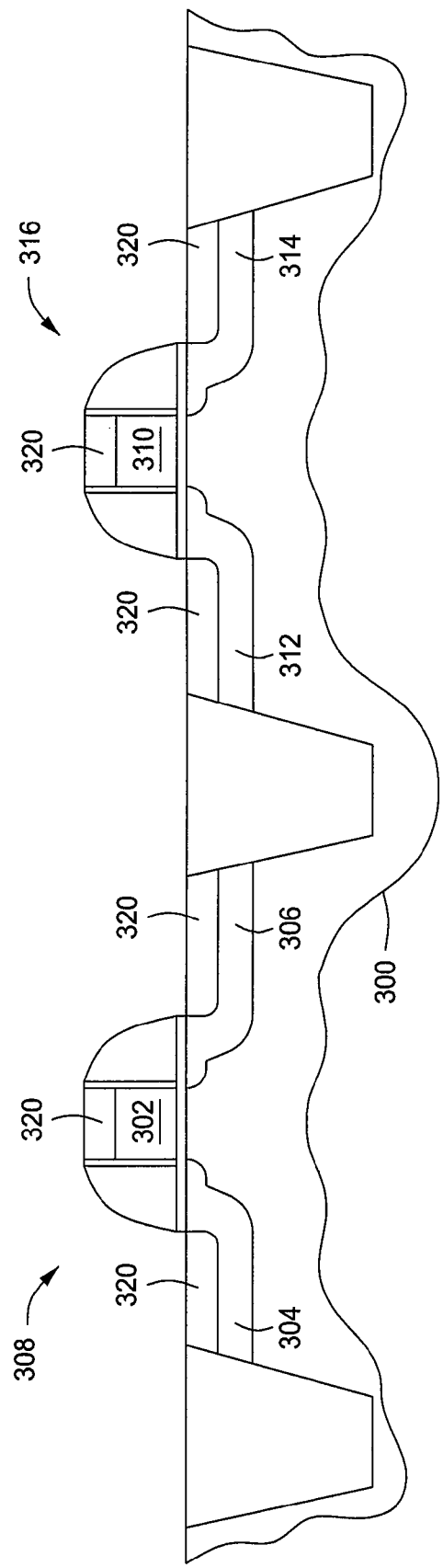

METHOD OF CONTROLLING METAL SILICIDE FORMATION

BACKGROUND OF THE INVENTION

1. Field of the Invention

Embodiments of the present invention generally relate to processes for growing material layers, and more specifically, to processes for controlling the formation of metal silicide atop exposed regions of a substrate.

2. Description of the Related Art

Metal films (e.g., Ni, Ni—Pt, Co, Ti) react with silicon (or Si—Ge) to form silicides. Silicides are utilized in device processing for the formation of contacts (e.g., source/drain, gate). During device processing, a silicide may be formed on single-crystal silicon material associated with the device source and drain regions, and on polysilicon material associated with the device gate region. Differences in the respective silicide reaction rates generally associated with single-crystal silicon and polysilicon can result in the silicide layer having a far greater thickness above the polysilicon of the gate region than it does above the single-crystal silicon of the respective source and drain regions. Such non-uniformity in the silicide layer thickness across different regions can create numerous problems with respect to manufacturability, reliability, and device performance.

Current methods for contending with the problem of silicide thickness non-uniformity include variations of an associated Rapid Thermal Anneal (RTA) treatment. One such variation includes two main steps. During a first RTA step, sometimes called a 'formation anneal step', a continuous metal film (e.g., Ni, Ni—Pt, Co, Ti) previously deposited atop the polysilicon and single-crystal silicon regions of the substrate (e.g., typically Si or SiGe) is reacted at a first temperature (e.g., generally a relatively low temperature, such as between about 250° C.-350° C.) such that a predetermined amount of the metal for use in forming the final silicide layer is locked into the silicon lattice in preparation for conversion into the final desired silicide. The 'locked-in' or reacted portion of the metal film is relatively evenly distributed across the various silicon and single-crystal silicon regions of the substrate. In some embodiments, a thin metal cap layer is formed atop the corresponding metal film (e.g., a thin titanium (Ti) cap layer may be formed atop a metal film comprising nickel (Ni)) prior to performing the first RTA to help control the subsequent metal silicide reaction. A wet chemistry is then used to etch away any unreacted portion of the metal film remaining on the substrate surface.

During the second RTA step, sometimes called a 'conversion anneal' step, the substrate is subjected to a second thermal treatment, usually at a higher temperature than that associated with the first RTA step (e.g., such as between about 400°-600° C.), to convert the previously-reacted metal locked within the silicon into a final silicide layer. Because the previously-reacted metal during the first RTA step was more or less evenly distributed within the silicon lattice and because excess metal is removed during the wet etch step, the final silicide layer generated during the second RTA step has a relatively uniform thickness. However, such a process requires additional steps (such as the etch step to remove excess metal and the second RTA step) which increases cost, lowers process throughput, generates excess waste, and the like.

Thus, there is a need for an improved method for controlling metal silicide formation.

SUMMARY OF THE INVENTION

Methods of processing silicon substrates to form metal silicide layers thereover having more uniform thicknesses are provided herein. In some embodiments, a method of processing a substrate includes providing a substrate having a plurality of exposed regions comprising silicon, wherein at least two of the plurality of exposed regions have a different rate of formation of a metal silicide layer thereover; doping at least one of the exposed regions to control the rate of formation of a metal silicide layer thereover; and forming a metal silicide layer upon the exposed regions of the substrate, wherein the metal silicide layer has a reduced maximum thickness differential between the exposed regions.

In some embodiments, a method of processing a substrate includes providing a substrate having exposed source and drain regions and an exposed gate layer comprising polysilicon; doping the polysilicon gate layer to reduce a rate of formation of a metal silicide over the polysilicon gate layer; and forming a metal silicide layer upon the source and drain regions and the doped polysilicon gate layer, wherein the metal silicide layer has a reduced thickness differential between the source and drain regions and the doped polysilicon gate layer.

BRIEF DESCRIPTION OF THE DRAWINGS

So that the manner in which the above-recited features of the present invention can be understood in greater detail, a more particular description of the invention may be had by reference to the appended drawings, illustrative of some embodiments of the present invention. It is to be noted, however, that the appended drawings depict only exemplary embodiments of the invention and are therefore not to be considered limiting of its scope, for the invention may admit to other equally effective embodiments.

FIGS. 3A-B depict an exemplary substrate in various stages of formation of multiple devices according to some embodiments of the invention.

Where possible, identical reference numerals are used herein to designate identical elements that are common to the figures. The images in the drawings are simplified for illustrative purposes and are not depicted to scale.

DETAILED DESCRIPTION

Embodiments of the present invention provide methods for controlling metal silicidation reactions. For example, embodiments of the present invention provide a method for doping one or more exposed silicon regions to control a respective rate of formation of a metal silicide layer thereupon so as to reduce a maximum thickness differential of the metal silicide layer between the exposed silicon regions (e.g., to provide greater thickness uniformity between the metal silicide layers).

Figure 1:
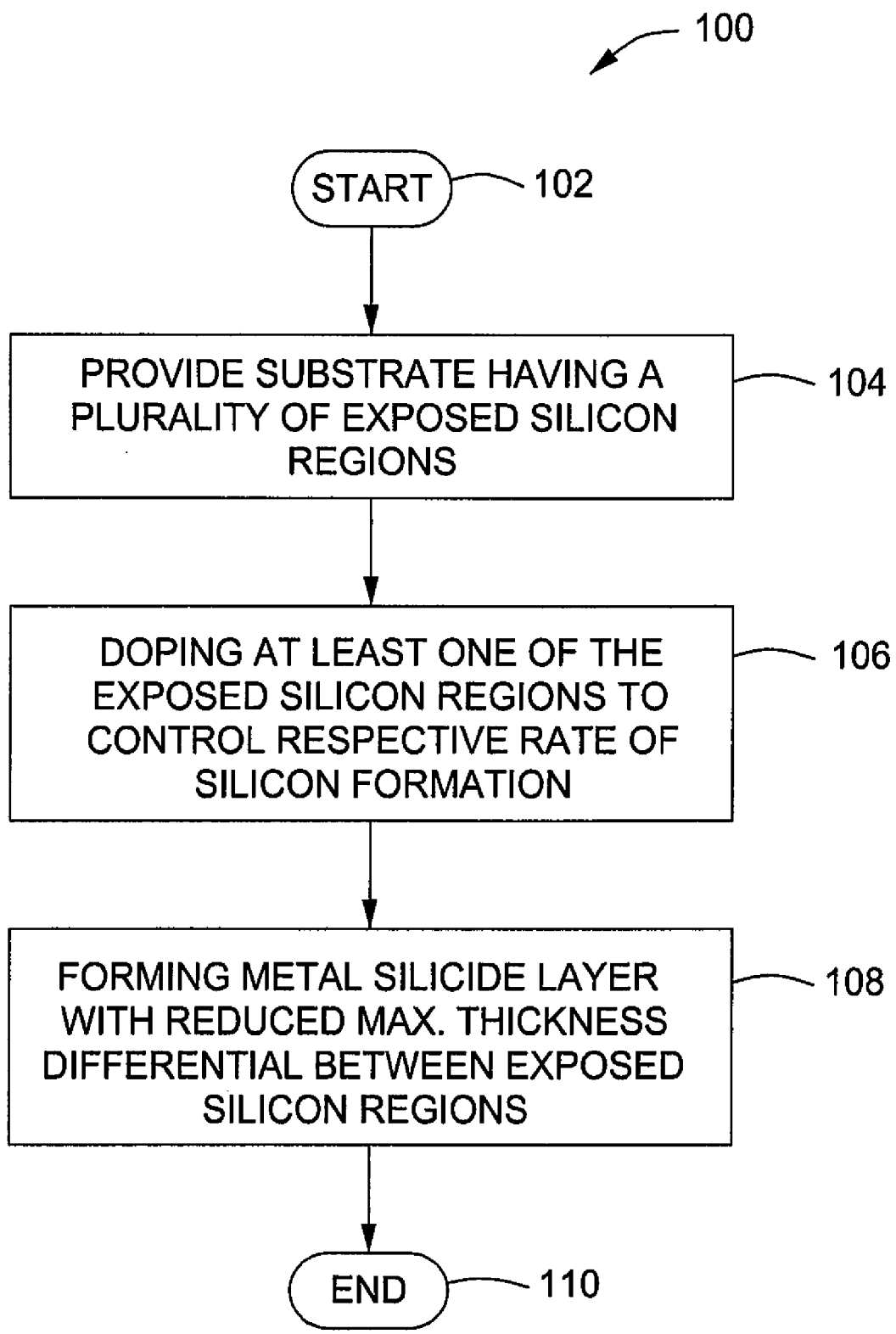
FIG. 1 depicts a flow diagram of a process for forming a metal silicide layer upon a plurality of exposed regions of silicon having a reduced maximum thickness differential therebetween according to some embodiments of the invention.

FIG. 1 is a flow diagram depicting an exemplary embodiment of a method 100 for processing a substrate in accordance with some embodiments of the invention. The method 100 begins at step 102, and then proceeds to step 104, where a substrate is provided having a plurality of exposed regions comprising silicon. The exposed regions comprising silicon may have different rates of formation of a metal silicide layer thereupon due to one or more of having different silicon lattice structures (e.g., single-crystal silicon versus polysilicon), the presence of different dopants in the exposed silicon regions (e.g., to define source and or drain regions or the like), or different physical dimensions (e.g., line widths, feature size, or the like).

Figure 2A:
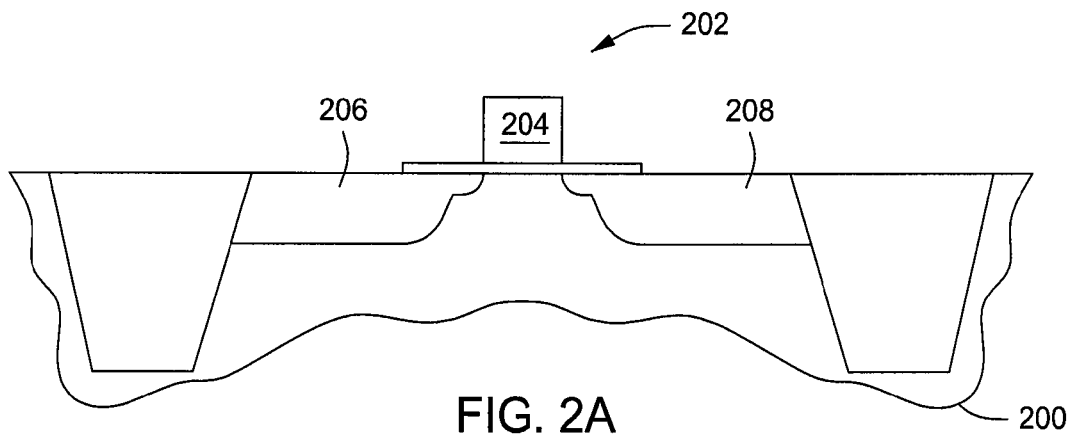
FIGS. 2A-C depict an exemplary substrate in various stages of formation of a device according to some embodiments of the invention.

In some embodiments, at least one of the plurality of exposed regions of the substrate comprises polysilicon and at least one other of the exposed regions of the substrate comprises single-crystal silicon (or silicon-germanium). For example, and as shown in FIG. 2A, a substrate 200 may be provided in which a device 202 is being formed. The device 202 may have a plurality of exposed regions comprising silicon, such as a polysilicon gate 204, a single-crystal silicon source region 206, and a single-crystal silicon drain region 208. It is contemplated that silicon-germanium may be utilized in place of single-crystal silicon throughout the application.

In some embodiments, the exposed regions of the substrate may comprise a plurality of structures being simultaneously formed. For example, and as shown in FIG. 3A, a substrate 300 may be provided having a plurality of exposed regions comprising silicon, including a polysilicon gate 302, a single-crystal silicon source region 304, and a single-crystal silicon drain region 306 associated with a first device 308 being formed on the substrate 300, and a polysilicon gate 310, a single-crystal silicon source region 312, and a single-crystal silicon drain region 314 associated with a second device 316 being formed on the substrate 300. The first and second devices 308, 316 may be similar devices or may be different. For example, in some embodiments, the first device 308 may be a p-doped metal oxide semiconductor field effect transistor (PMOSFET) having p+ doped source and drain regions (304, 306) and the second device 316 may be a n-doped MOSFETi (nMOSFET) having n+ doped source and drain regions (312, 314).

Next, at step 106, at least one of the plurality of exposed regions is doped to control a respective rate of formation of a metal silicide layer upon the exposed regions, thereby advantageously reducing a maximum thickness differential of the silicide layer between the exposed regions. For example, in the embodiment depicted in FIGS. 2A-C, the doping may be utilized to reduce a maximum thickness differential between respective silicide layers formed over the source and drain regions 206, 208 and over the polysilicon gate 204. Alternatively or in combination, in multiple device embodiments such as illustratively shown in FIGS. 3A-B, the doping may be utilized to reduce a maximum thickness differential between respective silicide layers formed over the respective source regions, drain regions, and polysilicon gates of the first and second devices 308, 316. It is contemplated that other structures having metal silicides formed over silicon layers having differing silicide formation rates (such as polysilicon and single-crystal silicon) may also advantageously utilize the inventive methods disclosed herein.

Figure 2B:
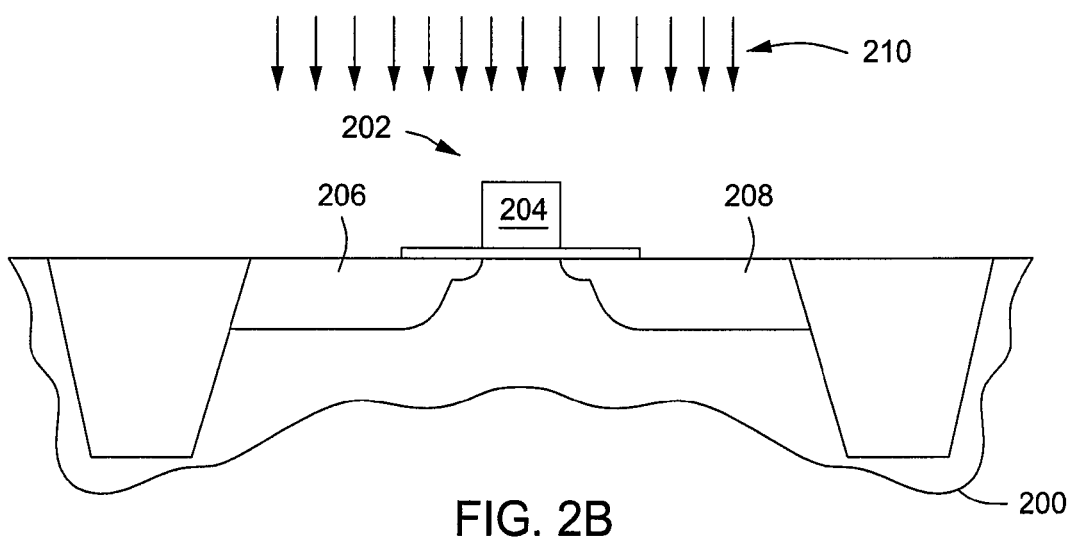

Examples of suitable dopants include one or more of group III elements or group V elements, such as, in a non-limiting example, arsenic (As), Boron (B), indium (In), phosphorous (P), antimony (Sb), or the like. The doping can be uniform or graded in concentration and may be performed using any suitable doping process, such as ion bombardment or implantation, diffusion doping, in-situ doping, plasma induced ion implantation (PIII), or the like, or combinations thereof. For example, as illustrated in FIG. 2B, the substrate 200 may be subjected to an ion bombardment process (e.g., a beam-line ion implantation process) indicated generally at reference numeral 210.

The doping of the exposed regions may be at least partially performed prior to, during, and/or after a related device feature has been formed therein. For example, in embodiments where the exposed silicon regions comprise source and drain regions and polysilicon gate regions, the doping process may be at least partially performed prior to the formation of these regions, during the formation process of these regions, and/or after the formation process for these regions. In addition, the doping of the exposed regions may further be performed as a modification of a typical doping process for forming the various components of the device being fabricated (such as doping of the source and/or drain regions, doping of the polysilicon gate, combinations thereof, and the like).

The polysilicon region may be doped with a graded concentration of a p-type or n-type specie (depending on the CMOS device) such that the silicide reaction rate can be tailored specifically to be a fraction (or, factor) of the source/drain (single-crystal) region. Accordingly, in some embodiments, an exposed region comprising polysilicon may be doped with one or more of the dopants disclosed above while at least one other of an exposed region comprising single-crystal silicon is left undoped, thereby advantageously reducing a maximum metal silicide layer thickness differential of a metal silicide film subsequently formed over the exposed regions. For example, the ion bombardment process 210 indicated generally in FIG. 2B may be an ion bombardment process in which the polysilicon gate 204 of the device 202 is doped with arsenic (As) while each of the source and drain regions 206, 208 of the device 202 remains undoped (e.g., each of the source and drain regions 206, 208 can be shielded as desired (not separately shown) to prevent its being doped via the ion bombardment process 210). The doping of one or more exposed silicon regions of the substrate 200 (e.g., doping the polysilicon gate 204 and not doping the source and drain regions 206, 208) advantageously reduces a rate of formation of a metal silicide over the polysilicon gate 204 to more closely match a lower rate of formation thereof over the single-crystal source and drain regions 206, 208.

In some embodiments, the doping of the exposed regions may vary from location to location on a given substrate. For example, exposed polysilicon regions having different line widths within a given device/chip may be doped with different dopant concentrations such that excessive reaction at the edges of the narrow line widths can be minimized, thereby effectively mitigating device performance degradation due to the so-called "narrow line width effect."

In some embodiments, a polysilicon exposed region may be doped with one or more of the above dopants, while at least one other of an exposed region comprising single-crystal silicon is doped with one or more of the above dopants at least partially differently than the doped polysilicon region(s). For example, one or more polysilicon exposed regions may be doped using one dopant, for example, arsenic (As) so as to reduce a rate of formation of a metal silicide over the polysilicon exposed region(s), and the at least one other of the single-crystal silicon exposed region(s) can be doped with a different level of the same dopant alone, with a same or different level of the same dopant in addition to another dopant, or with a different dopant altogether, thereby reducing the rate of formation of a metal silicide over the single-crystal silicon exposed region(s) to a lesser degree than the polysilicon exposed region(s), and thereby reducing the thickness variation between the metal silicide layers formed over the different regions.

After completion of the doping, at a step 108, a metal silicide layer is formed upon the exposed regions. Advantageously due to the doping performed at the step 104, the subsequently formed metal silicide layer may have a reduced maximum thickness differential between the exposed regions (e.g., more uniform metal silicide layers may be provided). In some embodiments, the metal silicide layer can be formed by reacting a metal film (not separately shown) comprising at least one of nickel (Ni), nickel-platinum (Ni—Pt), cobalt (Co), titanium (Ti), or the like, with the silicon (Si) or silicon-germanium (Si—Ge) of the exposed regions to form a corresponding metal silicide layer thereupon.

Figure 2C:
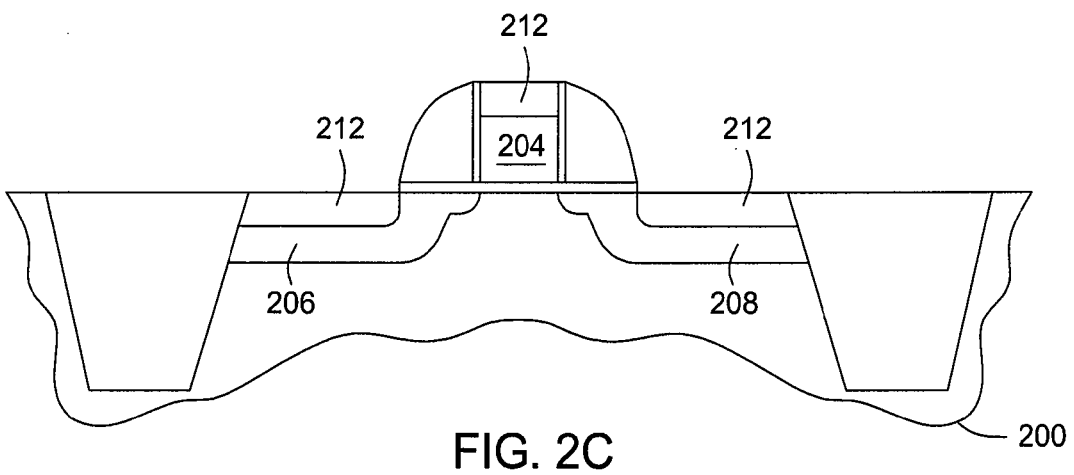

In some embodiments, and as illustrated in FIG. 2C, a metal silicide layer 212 having a reduced maximum thickness differential between the respective exposed regions (e.g., between the polysilicon gate 204, the single-crystal silicon source region 206, and the single-crystal silicon drain region 208) can be formed on the substrate 200.

In some embodiments, and as illustrated in FIG. 3B, a metal silicide layer 320 having a reduced maximum thickness differential between the respective exposed regions (e.g., the polysilicon gates 302, 310, the single-crystal silicon source regions 304, 312, and the single-crystal silicon drain regions 306, 314 associated with respective first and second devices 308, 316) can be formed on the substrate 300. It is contemplated that the metal silicide layer 320 may be controlled to be more uniform within a given device (e.g., within device 308 or 316) and/or to be more uniform across multiple devices formed on a given substrate or in a given process. For example, in embodiments where the first device 308 is a pMOSFET device and the second device 316 is an nMOSFET device, it has been observed that the n+ doped source and drain regions are typically much thinner than on the corresponding p+ doped source and drain regions. In such embodiments, the respective source and drain regions of devices 308, 316 may be differently doped per the teachings discussed above to minimize the thickness variation between the respective source and drain regions of devices 308, 316. Accordingly, the present inventive methods may be utilized to minimize the thickness variation not just between the respective source, drain and gate metal silicides within a given device, but also between the different devices formed on the substrate.

At a step 110, the method 100 ends.

Thus, the metal silicide layers formed over the exposed regions may have a reduced maximum thickness differential between the exposed regions utilizing a simplified annealing process when forming the metal silicide. For example, the metal silicide layer may be formed by reacting the corresponding metal film across each of the exposed regions simultaneously using a single thermal annealing step, as compared to two or more distinct annealing steps performed in sequence (such as the first and second RTA steps discussed above). In addition, the above metal silicide formation process advantageously eliminates the need for a wet etch step for removing unreacted portions of the corresponding metal film remaining on the substrate surface, and/or the need for forming a metal cap layer over the metal layer to be reacted with the underlying silicon layer.

Thus, improved methods for controlling metal silicidation reactions have been provided herein. In some embodiments, the inventive methods advantageously require fewer thermal anneal steps and/or wet etch steps as compared to conventional methods. In some embodiments, the inventive methods address the problem of excessive silicidation on polysilicon gates by selectively doping the polysilicon in advance of metal silicide formation to retard the respective silicidation rate, thereby beneficially reducing a maximum thickness differential of the metal silicide layer between the polysilicon gate and single-crystal silicon (or silicon-germanium) source and drain regions.

It is contemplated that other applications may benefit from the inventive methods disclosed herein. For example, certain high-k dielectric/metal gate applications employ fully silicided gates (FUSI) in conjunction with an underlying high-k dielectric layer. For example, a polysilicon gate electrode layer disposed over a high-k gate dielectric layer may get completely transformed into a silicide (such as nickel silicide NiSi) to fabricate the FUSI gate structure. However, in such applications, the polysilicon should get metallized fully while the metal (nickel (Ni) in the NiSi example) should not come into contact with the high-k dielectric underneath. Accordingly, the control of the silicidation of the polysilicon becomes critical. In such application, intelligently doping the metal gates in accordance with the teachings provided herein may advantageously facilitate control of the metal silicide reaction rate to ensure complete metal silicide formation while preventing or restricting the undesirable high-k dielectric layer-to-metal contact.

Figure 4:
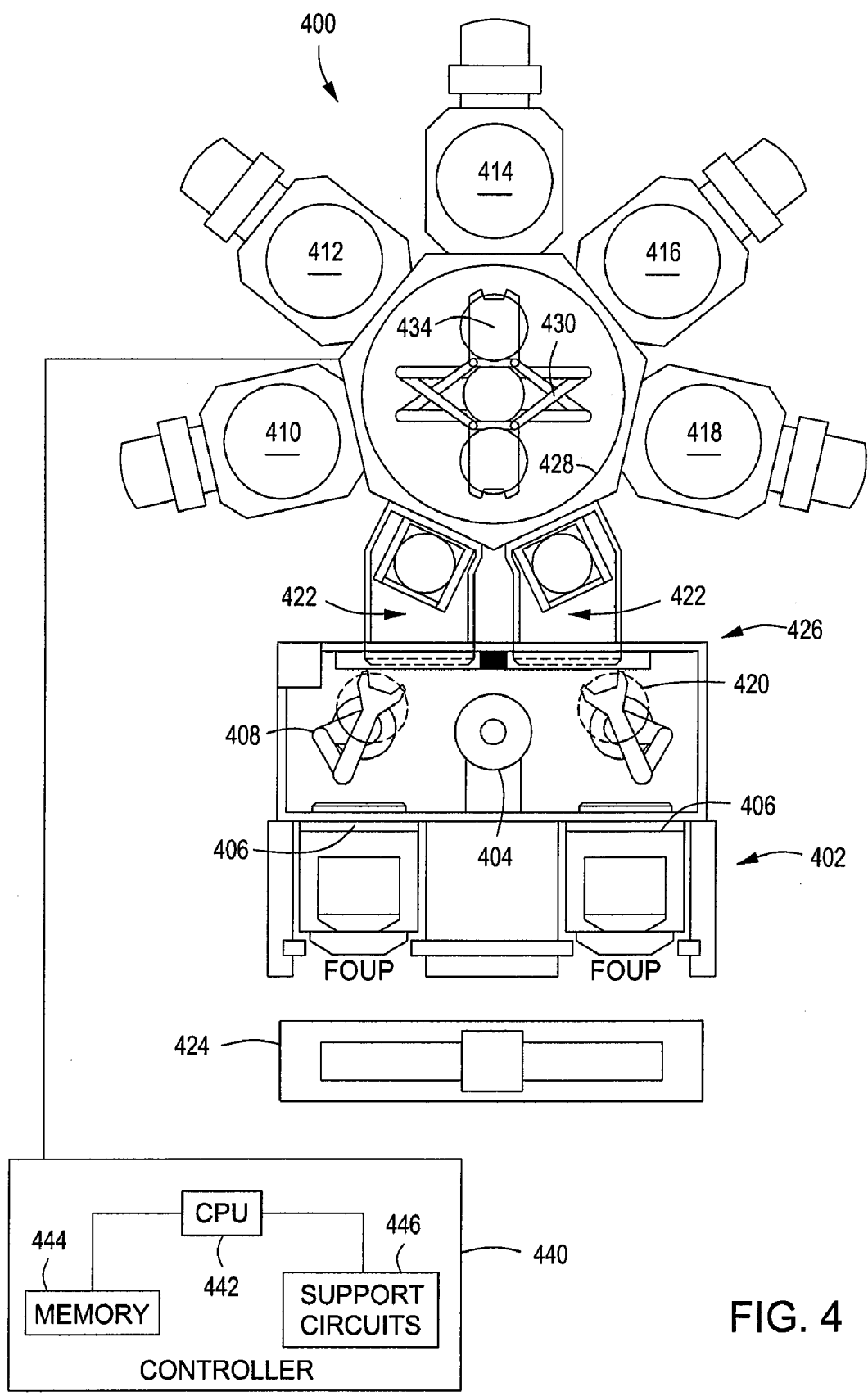
FIG. 4 depicts an exemplary schematic diagram of a process tool suitable for performing the process of FIG. 1.

FIG. 4 depicts a schematic diagram of an exemplary integrated semiconductor substrate processing system 400 (e.g., a cluster tool) of the kind that may be used to practice portions of the method 100 of FIG. 1 (such as the CENTURA® line of integrated processing systems, available from Applied Materials, Inc., of Santa Clara, Calif.). The particular embodiment of the system 400 is illustrative only and should not be used to limit the scope of the invention. It is contemplated that the method 100 may be practiced using other semiconductor substrate processing systems and/or processing reactors.

The integrated processing system 400 generally includes vacuum load-lock chambers 422, a vacuum-tight plenum 428 having a robot 430 supplied with a substrate receptacle 434, process modules 410, 412, 414, 416, and 418 coupled to the plenum 428, an input/output module 402, an optional metrology module 426, and a system controller 440. The load-lock chambers 422 are used as docking stations for substrate cassettes and protect the plenum 428 from atmospheric contaminants. The robot 430 transfers the substrates between the load lock chambers and process modules. The depicted embodiment of the robot 430 is exemplary and should not limit the scope of the invention. The input/output module 402 comprises at least one front opening unified pod (FOUP) 406 (two FOUPs 406 are depicted) facilitating an exchange of the substrate cassettes between a factory interface 424, the metrology module 426, and the load-lock chambers 422.

The system controller 440 generally comprises a central processing unit (CPU) 442, a memory 444, and support circuits 446 and is coupled to and controls modules and apparatus of the integrated processing system 400, as well as enables data collection and feedback from the respective modules to optimize performance of the system 400. In operation, the controller 440 uses a direct control of modules and apparatus of the system 400 or, alternatively, administers computers (or controllers) associated with these modules and apparatuses. The inventive method described above may be stored on a computer readable medium contained within, or accessible and/or controllable by, the system controller 440.

At least one of the processing modules 410, 412, 414, 416, and 418 may be an RTP reactor (such as a RADIANCE® reactor available from Applied Materials, Inc.), a PECVD reactor, a CVD reactor (such as an XGen reactor, also available from Applied Materials, Inc.), an ALD reactor, a DPN reactor and/or other reactor suitable for performing the processes described above with reference to FIG. 1. Additionally, at least one of the processing modules 410, 412, 414, 416 and 418 may be a plasma doping reactor, a beam-line implanter (such as a QUANTUM X PLUS® implanter, also available from Applied Materials, Inc.), and/or other implanter suitable for performing the processes described above with reference to FIG. 1. One example of a possible configuration of the system 400 for performing processes in accordance with the present invention includes two load-lock chambers 422, an RTP module 410, an implant module 412, an ALD module 414, a CVD module 416, a DPN module 418, a metrology module 426 comprising a measuring tool 404 and robots 408 and 420, and the input/output module 402 comprising two FOUPs 406. It is contemplated that other configurations of the system 400 may also be utilized to practice the invention described herein.

The invention may be practiced using other processes where parameters may be adjusted to achieve acceptable characteristics by those skilled in the art by utilizing the teachings disclosed herein without departing from the spirit of the invention. Although the forgoing discussion referred to fabrication of a field effect transistor, fabrication of the other devices and structures used in integrated circuits can also benefit from the invention.

While the foregoing is directed to embodiments of the present invention, other and further embodiments of the invention may be devised without departing from the basic scope thereof, and the scope thereof is determined by the claims that follow.

The invention claimed is:

1. A method of processing a substrate, comprising:
   providing a substrate having a plurality of exposed regions comprising silicon, wherein a first one or more of the exposed regions has a different rate of formation of a metal silicide layer thereover as compared to a second one or more of the exposed regions;
   doping the first exposed regions to control the rate of formation of the metal silicide layer over the first exposed regions to be closer to a rate of formation of the metal silicide layer over the second exposed regions; and
   forming a metal silicide layer upon the plurality of exposed regions of the substrate, wherein the metal silicide layer has a reduced maximum thickness differential between the exposed regions.

2. The method of claim 1, wherein the doping step includes doping the first exposed regions differently than the second exposed regions.

3. The method of claim 2, wherein at least some of the differently doped regions correspond to regions having different silicon lattice structures.

4. The method of claim 2, wherein at least some of the differently doped regions correspond to regions of materials having the same silicon lattice structure and different line widths.

5. The method of claim 1, wherein the doping step includes doping at least one of the exposed regions to reduce a rate of formation of the metal silicide layer upon the doped exposed regions.

6. The method of claim 1, wherein the doping step includes doping at least one of the exposed regions to reduce excessive silicidation thereupon.

7. The method of claim 1, wherein the doping step includes doping at least one of the exposed regions with at least one of a group III element or a group V element.

8. The method of claim 1, wherein the doping step includes doping at least one of the exposed regions with at least one of arsenic (As), boron (B), indium (In), phosphorous (P), or antimony (Sb).

9. The method of claim 1, wherein the doping step includes doping at least one of the exposed regions to reduce a rate of formation of the metal silicide layer thereupon by a first amount, and doping at least one other of the exposed regions to reduce a rate of formation of the metal silicide layer thereupon by a second amount different than the first.

10. The method of claim 1, wherein the exposed regions comprising silicon correspond to source, drain, and gate regions of at least one nMOSFET and to at least one pMOSFET being formed on the substrate, and wherein the doping step further comprises:
    doping exposed source and drain regions of at least one nMOSFET device differently than at least one pMOSFET prior to the metal silicide formation step, wherein subsequently formed metal silicide layer has a reduced thickness differential between the respective source and drain regions of the nMOSFET and the pMOSFET.

11. The method of claim 1, wherein forming the metal silicide layer comprises:
    reacting a metal film across each of the exposed regions simultaneously using a single thermal annealing step.

12. A method of processing a substrate, comprising:
    providing a substrate having exposed regions corresponding to a device being formed on the substrate, the exposed regions comprising exposed source and drain regions and an exposed gate layer comprising polysilicon;
    doping the polysilicon gate layer differently than the exposed source and drain regions to reduce a rate of formation of a metal silicide over the polysilicon gate layer; and
    forming a metal silicide layer upon the source and drain regions and the doped polysilicon gate layer, wherein the metal silicide layer has a reduced thickness differential between the source and drain regions and the doped polysilicon gate layer.

13. The method of claim 12, wherein the doping step includes doping the polysilicon gate layer with at least one of a group III element or a group V element.

14. The method of claim 12, wherein the doping step includes doping at least one of the exposed regions with at least one of arsenic (As), boron (B), indium (In), phosphorous (P) or antimony (Sb).

15. The method of claim 12, wherein the substrate further comprises a plurality of exposed source and drain regions and exposed gate layers comprising polysilicon, and wherein the doping step further comprises doping at least some of the exposed polysilicon gate layers differently than each other.

16. The method of claim 15, wherein at least some of the differently doped polysilicon gate layers correspond to gate structures having different line widths.

17. The method of claim 12, wherein the doping step further comprises doping the source and drain regions to decrease a rate of formation of a metal silicide over the source and drain regions by an amount less than the amount of decrease of the rate of formation of the metal silicide over the polysilicon gate layer.

18. The method of claim 12, wherein the substrate further comprises exposed source and drain regions and exposed gate layers comprising polysilicon corresponding to multiple devices being formed on the substrate.

19. The method of claim 12, wherein the exposed source and drain regions and exposed gate layers comprising polysilicon correspond to at least one nMOSFET and to at least one pMOSFET being formed on the substrate.

20. The method of claim 19, further comprising:
doping the exposed source and drain regions of at least one nMOSFET device differently than at least one pMOSFET prior to the metal silicide formation step, wherein subsequently formed metal silicide layer has a reduced thickness differential between the respective source and drain regions of the nMOSFET and the pMOSFET.

* * * * *